United States Patent [19]

Proebsting

[11] Patent Number: 4,506,347
[45] Date of Patent: Mar. 19, 1985

[54] PLACEMENT OF CLOCK CIRCUITS FOR SEMICONDUCTOR MEMORY

[75] Inventor: Robert J. Proebsting, Carrollton, Tex.

[73] Assignee: Mostek Corporation, Carrollton, Tex.

[21] Appl. No.: 236,239

[22] Filed: Feb. 20, 1981

[51] Int. Cl.³ .............................................. G11C 11/40
[52] U.S. Cl. ........................................ 365/51; 365/63
[58] Field of Search .................... 365/51, 63, 94, 189, 365/190, 205, 222, 149

[56] References Cited

U.S. PATENT DOCUMENTS

| 4,072,932 | 2/1978 | Kitagawa et al. | 365/207 X |
| 4,161,791 | 7/1979 | Leach | 365/222 |
| 4,255,679 | 3/1981 | White, Jr. et al. | 365/205 X |

Primary Examiner—Joseph A. Popek

[57] ABSTRACT

A dynamic random access memory (10) is fabricated on a substrate (12) and is divided into memory sections (14, 16). Memory cells (46) are connected to bit lines (18-28, a and b), which are organized into pairs that are connected to respective sense amplifiers (34-44). A row clock circuit (52) generates clock signals to enable the addressed word line. Additional clock signals are generated by other clock circuits (56, 58). A charge pump circuit (78, 80) produces a substrate bias and includes a free running oscillator. The signal generation circuits (52, 56, 58, 78, 80) produce signal transitions which are coupled by parasitic capacitors (66-76, 81-88) into the bit lines (18-28, a and b). The clock circuits are fabricated in a symmetrical placement in relation to the bit lines (18-28, a and b) and sense amplifiers (34-44) such that the transient signals capacitively coupled from the clock circuits into the bit lines have a very low differential mode amplitude. The reduced differential mode interference from the clock circuits permits the sense amplifiers (34-44) to more accurately read the states of the memory cells (46).

14 Claims, 1 Drawing Figure

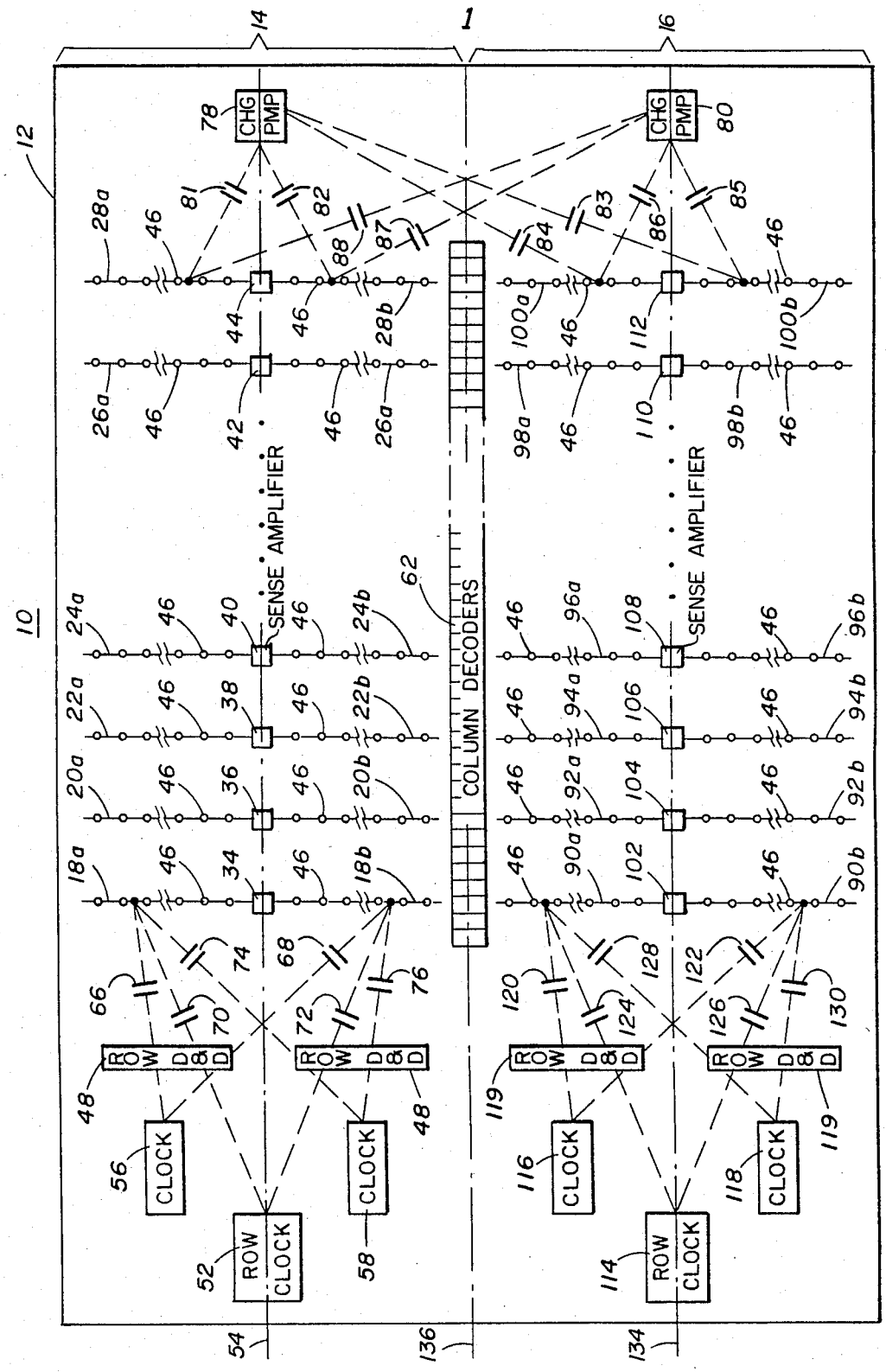

PLACEMENT OF CLOCK CIRCUITS FOR SEMICONDUCTOR MEMORY

TECHNICAL FIELD

The present invention pertains to integrated circuit semiconductor memories and more particularly to the placement of clock generator and similar circuits used with such memories.

BACKGROUND OF THE INVENTION

Semiconductor memory circuits are being developed with greater densities, primarily as a result of decreasing circuit geometries. For dynamic random access memories the greater density also reduces the quantity of charge which can be stored within each memory cell. The close spacing of circuit elements further tends to increase the electrical effect of the operation of one circuit upon another, particularly through capacitive coupling. There is also a trend to design semiconductor memories to operate from a single 5.0 volt supply. Each of these design factors tends to reduce the signal margin available for reading the voltage state stored in the memory cells of a dynamic random access memory. When a selected memory cell is coupled to a bit line, the change in voltage on the bit line can be very small. The coupling of electrical noise from other circuit elements within the semiconductor memory can change the amplitude of the signal on the bit lines such that there is insufficient signal level to correctly read the state of the memory cell. Clock circuits in particular can generate noise that can be propagated to the bit lines.

In view of these problems there exists a need for a design of circuit elements in a semiconductor memory to reduce the impact of electrical noise which is coupled into the bit lines from other circuits, such as clock generators, which operate on the same semiconductor substrate.

SUMMARY OF THE INVENTION

In a broad aspect of the present invention there is disclosed a placement of circuit components which form a portion of a semiconductor memory that is fabricated on a substrate. The semiconductor memory includes a plurality of bit lines which are organized in pairs on the substrate. A circuit, which must necessarily generate transient signals at or slightly before the bit lines are sensed, is fabricated and located on the substrate relative to the bit lines such that the capacitive coupling from the circuit to the first bit line of each pair of bit lines is essentially equal to the capacitive coupling from the circuit to the second bit line of each pair of bit lines. The equal capacitive coupling serves to substantially reduce the differential mode noise coupled from the circuit into the bit lines.

BRIEF DESCRIPTION OF THE DRAWINGS

For a more complete understanding of the present invention and the advantages thereof, reference is now made to the following description taken in conjunction with the accompanying drawing in which the FIGURE is a plan view of a semiconductor memory illustrating the positional relationships between various circuits and elements of the semiconductor memory.

DETAILED DESCRIPTION OF THE INVENTION

Referring now to the FIGURE there is illustrated a dynamic semiconductor memory 10 which is fabricated on a substrate 12. Only those portions of the semiconductor memory circuit are shown which are needed to illustrate the present invention.

The memory 10 is divided into two essentially similar sections 14 and 16. Either section, 14 or 16, can stand alone as a memory circuit. Within section 14 there is a field of memory cells with the memory cells selectively connected to bit lines within the field. The bit lines are organized into pairs within the field. Representative examples of the bit line pairs are shown as 18-28, each with bit lines a and b. Each of the pairs of bit lines is connected to a sense amplifier with sense amplifiers 34-44 corresponding to bit line pairs 18-28. A group of bit lines can possibly be connected to a single sense amplifier.

Each of the memory cells in the memory 10 is represented by a small circle on a bit line. Representative ones of the memory cells are shown by the reference numeral 46.

A particular memory cell is read or written by decoding both a row and column address. The row portion of the address is decoded by row decoder and driver circuits 48 which activate the appropriate cells within the field of memory cells.

The row decoder and driver circuits 48 operate in conjunction with clock signals which are received from a row driver clock circuit 52 which is also termed a word enable clock line generator. The sense amplifiers 34-44 and the row clock circuit 52 are placed on the substrate 12 along a common line 54.

Clock circuit 56 and 58 represents a divided clock circuit for the memory 10. Circuits 56 and 58 have essentially the same circuit configuration and produce the same operational signals at the same time. Circuits 56 and 58 are spaced symmetrically on opposite sides of line 54. The row clock circuit 52 can likewise be divided into two circuit groups such as circuits 56 and 58.

The column portion of the address is received by column decoder circuits 62 which select the appropriate column within the memory field.

Each of the clock circuits described above is connected through parasitic capacitance to each of the bit lines within the memory field. The parasitic capacitance is at least in part due to the substrate 12. An example of the parasitic capacitance between the clock circuits 52, 56 and 58 and the bit lines 18a and 18b is illustrated. Clock circuit 56 is coupled to bit line 18a through a parasitic capacitor 66. Circuit 56 is connected to bit line 18b through a parasitic capacitor 68. The row clock circuit 52 is coupled to bit line 18a through a parasitic capacitor 70 and to bit line 18b through a parasitic capacitor 72. The clock circuit 58 is coupled to bit line 18a through a capacitor 74 and is coupled to bit line 18b through a capacitor 76. The bit lines and clock circuits are shown interconnected by dashed lines to indicate the parasitic nature of the capacitance as opposed to the deliberate fabrication of capacitors in the semiconductor memory 10. Note that the clock circuits described above are also coupled through parasitic capacitances to each of the other bit lines in the memory 10.

A further circuit within the memory 10 is a charge pump circuit which comprises circuit groups 78 and 80. The circuits 78 and 80 are essentially the same and produce the same signals at the same time. The charge pump generates a voltage to bias the substrate. The charge pump includes a free running oscillator which produces electrical noise that is likewise coupled through parasitic capacitors to the bit lines of the memory 10. This parasitic capacitance is represented by capacitors 81, 82, 83, 84, 85, 86, 87 and 88. Circuit 78 is coupled to bit lines 28a and 28b through capacitors 81 and 82 respectively. Circuit 80 is coupled to bit lines 28a and 28b through capacitors 88 and 87 respectively. Circuits 78 and 80 are likewise coupled to the remaining bit lines in memory 10 through parasitic capacitance (not shown).

Section 16 of memory 10 is essentially the same as section 14. Section 16 includes bit line pairs 90-100, each having bit lines a and b. These bit line pairs are connected respectively to sense amplifiers 102-112. Section 16 further includes row clock circuit 114, clock circuits 116 and 118 and row decoder and driver circuits 119. The parasitic capacitance is represented by capacitors 120-130. The row clock circuit 114 and sense amplifiers 102-112 are positioned on a center line 134. The clock circuits 116 and 118 are positioned symmetrically on opposite sides of line 134. The memory cells are likewise represented by the reference numerals 46.

The parasitic capacitor 84 couples the charge pump circuit 78 to bit line 100a and capacitor 83 couples circuit 78 to bit line 100b. Likewise the capacitor 86 couples charge pump circuit 80 to bit line 100a and capacitor 85 couples charge pump circuit 80 to bit line 100b.

In the read operation of the memory 10 a selected one of the memory cells 46 is connected to one of the two bit lines of the corresponding bit line pair. The charge state on the memory cell changes the charge state on the connected bit line. The sense amplifier connected between the pair of bit lines functions as a differential amplifier to detect the voltage difference between the two bit lines connected to the sense amplifier. The sense amplifier thus determines the state of the selected memory cell and this data state is output from the memory 10. As can be seen from this brief description the reliability in reading the state of a memory cell is primarily determined by the differential signal level between the bit lines of a pair of bit lines. This has become even more critical as circuit geometries have become smaller and there is less charge to detect. There is also a general tendency to reduce the supply voltage for a memory to 5.0 volts from 12.0 volts which has previously been used. This further tends to reduce the amplitude of the detected signal on the bit lines.

The various clock generator and charge pump circuits described above produce undesirable signal transients which are propagated through the parasitic capacitances to the bit lines. When such signals are propagated into one bit line of a pair, during or slightly before the sensing portion of the memory cycle, the differential signal between the bit lines can be altered thereby causing the sense amplifier to improperly read the state of the selected memory cell. The row driver clock circuit is especially troublesome in this regard since it produces a clock pulse just before the time of the sensing of the voltage differential between the bit lines. The row driver clock circuit produces a pulse which connects the memory cells to a bit lines immediately before sensing of the voltage differential betwen the bit lines.

The charge pump circuits 78 and 80 produce a continuous oscillatory signal which may be asynchronous with the operation of the memory circuit. The signal transitions produced by the charge pump are propagated into the bit lines at unpredictable times. If the charge pump should produce a transient at approximately the time for sensing of the bit lines, the transient could be coupled into a bit line and cause erroneous reading of the memory state. It is difficult to test the memory to determine the worst case interference caused by the charge pump signal since even a prolonged period of testing may not produce the particular critical coincidence of the charge pump signal with the reading of a particular memory cell.

In order to reduce the magnitude of the differential signals coupled into the bit lines, the present invention comprises a placement of circuits which produce undesirable transient signals at or near the time of sensing of the bit lines. The circuits are located in a symmetrical arrangement in regard to the bit lines so that equal amplitude signals are capacitively coupled into the bit lines of each pair. This arrangement reduces the amplitude of the differential signals although it does not necessarily reduce the amplitude of the common mode signals.

Referring to section 14 of the FIGURE the row clock circuit 52 produces transient signals which are capacitively coupled through capacitors 70 and 72 into bit lines 18a and 18b. Since circuit 52 is physically located on the center line between the bit lines 18a and 18b and the substrate is essentially uniform, the coupling of parasitic capacitors 70 and 72 will be similar. This similar coupling causes essentially similar amplitude signals to be induced into the bit lines 18a and 18b. However, the signal coupled into bit line 18a from circuit 52 likely has a slightly greater amplitude than that of the signal from circuit 52 coupled into bit line 18b. But, the effect of the corresponding clock circuit in section 16 of memory 10 has a similar but inverse effect on bit lines 18a and 18b to cause a balancing of the amplitude of the transient signal coupled into bit lines 18a and 18b. Since the reading of a state of a memory cell is determined by the voltage differential between the bit lines of a pair of bit lines, the transients produced by the row clock circuit 52 will have little effect because the amplitudes of the signals induced into each of the bit lines of a pair will be almost exactly the same. The common mode signal induced into the bit lines by the row clock circuit 52 and the corresponding circuit in section 16 will have little or no effect upon the reading of the state of the state of a memory cell.

The row clock circuit 52 and corresponding circuit in section 16 are likewise capacitively coupled to the remainder of the bit lines in the section 14 of memory 10. Although the absolute amplitude of the signals induced into the remaining bit lines will differ, the differential induced signals will remain very small. Thus, the placement of the row clock circuit 52 along the center line of the bit lines substantially eliminates the coupling of differential mode noise into the bit lines of each pair of bit lines.

The clock circuits 56 and 58 function essentially in tandem and produce the same signals. Circuit 56 couples a transient signal through capacitor 66 into bit line 18a and couples a transient signal through capacitor 68 into bit line 18b. Since the circuit 56 is physically located closer to bit line 18a than bit line 18b, a greater amplitude signal will be induced into bit line 18a. The clock circuit 58 likewise couples the transient signal into bit lines 18a and 18b through capacitors 74 and 76 respectively. The transient signal from circuit 58, which is coupled into bit line 18a, will have a lesser amplitude than the signal which is coupled through capacitor 76 into bit line 18b. The signal coupled by capacitor 66 from circuit 56 to bit line 18a will be essentially equal to the signal coupled by capacitor 76 from circuit 58 into bit line 18b. Similarly the signal coupled by capacitor 74 from circuit 58 into bit line 18a will be essentially equal to the signal coupled by capacitor 68 from circuit 56 into bit line 18b. The effects of the circuits in section 16 which correspond to circuits 56 and 56 similarly balance the coupled signals as described for circuit 52 above. Therefore, the composite of coupled signals from the circuits 56 and 58 will produce approximately equal amplitude signals in the bit lines 18a and 18b. This same coupling effect is present with each of the remaining pairs of bit lines in the semiconductor memory section 14. Thus, the placement of substantially identical clock circuits producing the same clock signals symmetrically on opposite sides of the center line 54 limits the amplitude of differential mode signals coupled in the bit lines.

The same effect described above occurs with the row clock circuit 114, clock circuits 116 and 118 and the bit lines 90-100 in section 16 of memory 10.

The charge pump circuits 78 and 80 likewise operate in tandem and produce oscillatory signals. These signals, however, are not necessarily in synchronism with the operation of the memory cycle. Circuit 78 induces signals into the bit lines 28a and 28b through capacitors 81 and 82 due to the placement of the circuit 78 on the center line 54. Likewise the charge pump circuit 80 induces equal amplitude signals into the bit lines 100a and 100b through capacitors 86 and 85 due to the placement of circuit 80 on the center line 134. The circuit 78 also couples transient signals through capacitors 84 and 83 into bit lines 100a and 100b. The circuit 80 couples transient signals through capacitors 88 and 87 into bit lines 28a and 28b. Although it would appear that the capacitively coupled signals from the charge pump in one section of the memory 10 would produce unequal differential signals in the bit lines in the other section of the memory 10, this is not the case. Due to the symmetry of the placement of the charge pump circuit 78 and 80 about the center line 136 of memory 10 and the placement of the charge pump circuits on the center lines 54 and 134 of the respective sections 14 and 16 there will be a matching of capacitive coupling such that the differential mode signals in the bit line pairs 28 and 100 still remain essentially zero. This same effect occurs with the clock circuits 52, 56, 58, 114, 116 and 118 such that the signals produced in one section of the memory 10 have little or no effect on the bit lines in the other section of the memory 10.

For the purposes of the present invention the word enable line clock generator and charge pump can be interchanged in placement on the substrate and retain the desired effect of reduced differential mode coupling into the bit lines.

In summary, the present invention comprises a placement of bit lines in relation to synchronous and nonsynchronous clock circuits on a semiconductor memory such that the capacitively coupled signals from the clock circuits into the bit lines have a minimum differential mode amplitude.

Although several embodiments of the invention have been illustrated in the accompanying drawing and described in the foregoing detailed description, it will be understood that the invention is not limited to the embodiments disclosed, but is capable of numerous rearrangements, modifications and substitutions without departing from the scope of the invention.

I claim:

1. A placement of circuit components on a semiconductor substrate to form a portion of an integrated circuit memory which has a plurality of memory cells, comprising:
   a plurality of bit lines coupled to said memory cells, fabricated on said substrate and organized into pairs within groups;
   a sense amplifier coupled to each of said pairs of bit lines for reading one of said memory cells by sensing a voltage differential between the bit lines of one of said pairs connected thereto; and
   a circuit which generates transient signals at or immediately before a time said sense amplifiers sense the voltages on the bit lines connected thereto, said circuit located on said substrate such that a parasitic capacitive coupling from said circuit to a first bit line of a pair of said bit lines is essentially equal to a parasitic capacitive coupling to the second bit line in the pair of bit lines.

2. The combination recited in claim 1 wherein said circuit is a word enable line clock generator.

3. The combination recited in claim 1 wherein said circuit is a charge pump generator.

4. The combination recited in claim 1 wherein said sense amplifier and said circuit are located along a common line.

5. A placement of circuit components on a semiconductor substrate to form a portion of an integrated circuit memory which has a plurality of memory cells, comprising:
   a plurality of bit lines coupled to said memory cells and fabricated on said substrate and organized in pairs;
   sense amplifiers each disposed between each bit line of said pairs of bit lines for reading said memory cells by sensing a voltage differential between said pairs of bit lines connected thereto; and
   a circuit which generates transient signals at or immediately before a time said sense amplifiers sense the voltages on the bit lines connected thereto said circuit located on said substrate such that a parasitic capacitive coupling from said circuit to the first bit line of each of said pairs of bit lines is essentially equal to a parasitic capacitive coupling from said circuit to the second bit line of each of said pairs of bit lines.

6. The combination recited in claim 5 wherein said circuit is a word enable line clock generator.

7. The combination recited in claim 5 wherein said circuit is a charge pump generator.

8. The combination recited in claim 5 wherein said sense amplifiers and said circuit are located along a common line.

9. A placement of circuit components on a semiconductor substrate to form a portion of a semiconductor memory which has a plurality of memory cells comprising:
   a plurality of bit lines coupled to said memory cells, fabricated on said substrate and organized in pairs;
   sense amplifiers each disposed between each bit line of a pair of said bit lines for reaing said memory cells by sensing a voltage differential between said pair of said bit lines connected thereto; and an additional circuit component which generates transient signals at or immediately before a time said sense amplifiers sense the voltages on the bit lines connected thereto, said additional circuit component positioned in a symmetrical arrangement with respect to the first and second bit lines in each of said pairs of bit lines.

10. The combination recited in claim 9 wherein said additional circuit component is a word enable line clock generator.

11. The combination recited in claim 9 wherein said additional circuit component is a charge pump generator.

12. A placement of circuit components on a semiconductor substrate to form a portion of an integrated circuit memory which has a plurality of memory cells separated into first and second sections, comprising:

a plurality of pairs of bit lines coupled to said memory cells in said first and second sections;

sense amplifiers for reading said memory cells by detecting a voltage differential between a pair of bit lines connected thereto, the sense amplifiers for the bit lines in the first section located along a first common line, and the sense amplifiers for the bit lines in the second section located along a second common line; and an additional circuit component which generates transient signals at or immediately before a time said sense amplifiers sense the voltages on the bit lines connected thereto, said additional circuit component comprising essentially similar first and second groups of components, said first group of components located on said first common line and said second group of components located on said second common line.

13. The combination recited in claim 12 wherein said additional circuit component comprises a word enable line clock generator.

14. The combination recited in claim 12 wherein said additional circuit component comprises a charge pump circuit.

* * * * *